United States Patent
Denpoh (10) Patent No.: US 7,691,226 B2
(45) Date of Patent: Apr. 6, 2010

(54) ELECTRON TEMPERATURE MEASUREMENT METHOD, ELECTRON TEMPERATURE MEASUREMENT PROGRAM FOR IMPLEMENTING THE METHOD, AND STORAGE MEDIUM STORING THE ELECTRON TEMPERATURE MEASUREMENT PROGRAM

(75) Inventor: Kazuki Denpoh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 995 days.

(21) Appl. No.: 11/387,813

(22) Filed: Mar. 24, 2006

(65) Prior Publication Data

US 2006/0214593 A1  Sep. 28, 2006

Related U.S. Application Data

(60) Provisional application No. 60/666,705, filed on Mar. 31, 2005.

(30) Foreign Application Priority Data

Mar. 24, 2005  (JP) ............................... 2005-086285

(51) Int. Cl.
  *H01L 21/00* (2006.01)
  *C23C 14/00* (2006.01)
  *C23C 16/00* (2006.01)

(52) U.S. Cl. ............................ 156/345.24; 156/345.25; 156/345.28; 118/712; 315/111.21

(58) Field of Classification Search ................. None
  See application file for complete search history.

(56) References Cited

FOREIGN PATENT DOCUMENTS

JP         05-299194         11/1993

OTHER PUBLICATIONS

Article (Experimental Evidence of Increased Electron Temperature, Plasma Potential, and Ion Energy near an ICRF antenna Faraday shield) by Coughman et al 1990.*

* cited by examiner

*Primary Examiner*—Ram N. Kackar
(74) *Attorney, Agent, or Firm*—Oblon, Spivak, McClelland, Maier & Neustadt, L.L.P.

(57) ABSTRACT

An electron temperature measurement method that enables an electron temperature as a plasma parameter to be measured precisely.

A plasma is produced in a chamber 11 such that a wafer W is subjected to reactive ion etching therein. An ion energy distribution in the chamber 11 is measured. An ion energy distribution in the chamber 11 is simulated based on a set electron temperature. The measured ion energy distribution and the simulated ion energy distribution are compared. The electron temperature of the plasma is estimated based on results of the comparison mentioned above.

4 Claims, 9 Drawing Sheets

ELECTRON TEMPERATURE MEASUREMENT METHOD, ELECTRON TEMPERATURE MEASUREMENT PROGRAM FOR IMPLEMENTING THE METHOD, AND STORAGE MEDIUM STORING THE ELECTRON TEMPERATURE MEASUREMENT PROGRAM

BACKGROUND OF THE INVENTION

1. Field of the Invention

The present invention relates to an electron temperature measurement method, an electron temperature measurement program for implementing the method, and a storage medium storing the electron temperature measurement program.

2. Description of the Related Art

In recent years, as etching carried out on wafers (substrates) in a vacuum processing chamber (hereinafter merely referred to as the "chamber") has been made finer and metallic films formed on such wafers in such a chamber have been made thinner, it has become required to precisely measure the state of plasma in the chamber, in particular plasma parameters.

A commonly known method of measuring such plasma parameters in such a chamber is a so-called Langmuir probe method in which a probe that has been given electrical potential is directly inserted into the chamber, and plasma parameters such as the plasma density, the electron temperature of the plasma, the plasma potential, and the sheath potential are measured based on the value of a current that flows through the probe due to collisions of electrons and ions in the plasma with the inserted probe.

In the Langmuir probe method, it is necessary to determine and then analyze the voltage-current characteristic, and hence the method is not suitable for reading the plasma parameters directly. A direct plasma parameter reading method in which the plasma parameters are read directly has thus been developed. In this method, two probes are used, the probes are set to suitably chosen potentials, and the plasma parameters are determined from the ratio of the currents flowing through the two probes simultaneously (see, for example, Japanese Laid-open Patent Publication (Kokai) No. H05-299194).

Furthermore, the frequencies of radio waves absorbed by a plasma change in accordance with the density of the plasma, and hence a plasma absorption probe method has also been developed in which radio waves of a plurality of frequencies are emitted from a probe inserted into the chamber, the extent of absorption of the radio waves at each frequency is measured, and the plasma density is estimated based on the measured extent of absorption of the radio waves.

However, none of the above methods have been adequate as a method of measuring the electron temperature as a plasma parameter.

For example, with the Langmuir probe method or the direct plasma parameter reading method, the measurement cannot follow rapid changes over time in the potential in the chamber caused by the application of radio frequency electrical power for producing the plasma, and hence the measured electron temperature is unstable and imprecise.

Moreover, with the plasma absorption probe method, only the plasma density can be measured; the electron temperature cannot be measured.

SUMMARY OF THE INVENTION

It is an object of the present invention to provide an electron temperature measurement method, an electron temperature measurement program for implementing the method, and a storage medium storing the electron temperature measurement program, that enable the as a plasma parameter to be measured precisely.

To attain the above object, in a first aspect of the present invention, there is provided an electron temperature measurement method for measuring an electron temperature of a plasma produced in a vacuum processing chamber in which an object to be processed is subjected to plasma processing, the method comprising an ion energy distribution measurement step of measuring an ion energy distribution in the vacuum processing chamber, an ion energy distribution simulation step of simulating an ion energy distribution in the vacuum processing chamber based on a set electron temperature, an ion energy distribution comparison step of comparing the measured ion energy distribution and the simulated ion energy distribution, and an electron temperature estimation step of estimating the electron temperature of the plasma based on results of the comparison in the ion energy distribution comparison step.

According to the construction of the first aspect as described above, the ion energy distribution in the vacuum processing chamber is measured, the ion energy distribution in the vacuum processing chamber is simulated based on a set electron temperature, the measured ion energy distribution and the simulated ion energy distribution are compared, and the electron temperature of the plasma is estimated based on the results of the comparison. There is a correlation between the ion energy distribution in the vacuum processing chamber and the electron temperature. Moreover, the ion energy distribution can be measured precisely, and furthermore if the electron temperature is set to a predetermined value then the ion energy distribution can be simulated. Consequently, in the case that the measured ion energy distribution and the simulated ion energy distribution are the same as or closely approximate one another, if the electron temperature used in the ion energy distribution simulation is estimated as being the electron temperature of the plasma in the vacuum processing chamber, then the electron temperature as a plasma parameter can be measured precisely.

To attain the above object, in a second aspect of the present invention, there is provided an electron temperature measurement program for causing a computer to implement an electron temperature measurement method for measuring an electron temperature of a plasma produced in a vacuum processing chamber in which an object to be processed is subjected to plasma processing, the program comprising an ion energy distribution measurement module for measuring an ion energy distribution in the vacuum processing chamber, an ion energy distribution simulation module for simulating an ion energy distribution in the vacuum processing chamber based on a set electron temperature, an ion energy distribution comparison module for comparing the measured ion energy distribution and the simulated ion energy distribution, and an electron temperature estimation module for estimating the electron temperature of the plasma based on results of the comparison in the ion energy distribution comparison module.

Preferably, the ion energy distribution comparison module compares an energy value at which a secondary peak arises in the measured ion energy distribution and an energy value at which a corresponding secondary peak arises in the simulated ion energy distribution.

According to the construction of the second aspect as described above, in the comparison between the measured ion energy distribution and the simulated ion energy distribution, the energy value at which a secondary peak arises in the measured ion energy distribution and the energy value at which a corresponding secondary peak arises in the simulated ion energy distribution are compared. There is a strong correlation between the energy values at which the secondary peaks arise in the ion energy distribution and the electron temperature. Consequently, by comparing the energy values at which a secondary peak arises, the electron temperature as a plasma parameter can be measured more precisely.

Preferably, the electron temperature measurement program further comprises an electron temperature tentative setting module for tentatively setting the electron temperature used in the ion energy distribution simulation to a predetermined value.

According to the construction of the second aspect as described above, the electron temperature used in the ion energy distribution simulation is tentatively set to a predetermined value. As a result, the number of times that the ion energy distribution simulation is repeated in accordance with the results of the comparison between the measured ion energy distribution and the simulated ion energy distribution can be reduced, and hence the electron temperature as a plasma parameter can be measured quickly.

Preferably, the electron temperature measurement program comprises an other plasma parameter estimation module for estimating a plasma density and a sheath potential based on results of the comparison in the ion energy distribution comparison module.

According to the construction of the second aspect as described above, the plasma density and the sheath potential are estimated based on the results of the comparison between the measured ion energy distribution and the simulated ion energy distribution. There is a correlation between the ion energy distribution in the vacuum processing chamber and the plasma density and sheath potential. Moreover, if the plasma density and sheath potential are each set to a predetermined value then the ion energy distribution can be simulated. Consequently, in the case that the measured ion energy distribution and the simulated ion energy distribution are the same as or closely approximate one another, if the plasma density and sheath potential used in the ion energy distribution simulation are estimated as being the plasma density and sheath potential in the vacuum processing chamber, then the plasma density and the sheath potential as plasma parameters can be measured precisely.

More preferably, the ion energy distribution comparison module compares an energy value at which a primary peak arises in the measured ion energy distribution and an energy value at which a primary peak arises in the simulated ion energy distribution.

According to the construction of the second aspect as described above, in the comparison between the measured ion energy distribution and the simulated ion energy distribution, the energy value at which a primary peak arises in the measured ion energy distribution and the energy value at which a primary peak arises in the simulated ion energy distribution are compared. There is a strong correlation between the energy value at which the primary peak arises in the ion energy distribution and the plasma density and sheath potential. Consequently, by comparing the energy values at which the primary peak arises, the plasma density and sheath potential as plasma parameters can be measured more precisely.

To attain the above object, in a third aspect of the present invention, there is provided a computer-readable storage medium storing a program for causing a computer to implement an electron temperature measurement method for measuring an electron temperature of a plasma produced in a vacuum processing chamber in which an object to be processed is subjected to plasma processing, the program comprising an ion energy distribution measurement module for measuring an ion energy distribution in the vacuum processing chamber, an ion energy distribution simulation module for simulating an ion energy distribution in the vacuum processing chamber based on a set electron temperature, an ion energy distribution comparison module for comparing the measured ion energy distribution and the simulated ion energy distribution, and an electron temperature estimation module for estimating the electron temperature of the plasma based on results of the comparison in the ion energy distribution comparison module.

The above and other objects, features, and advantages of the invention will become more apparent from the following detailed description taken in conjunction with the accompanying drawings.

DETAILED DESCRIPTION OF THE PREFERRED EMBODIMENTS

The present invention will now be described in detail with reference to the drawings showing preferred embodiments thereof.

Figure 1:
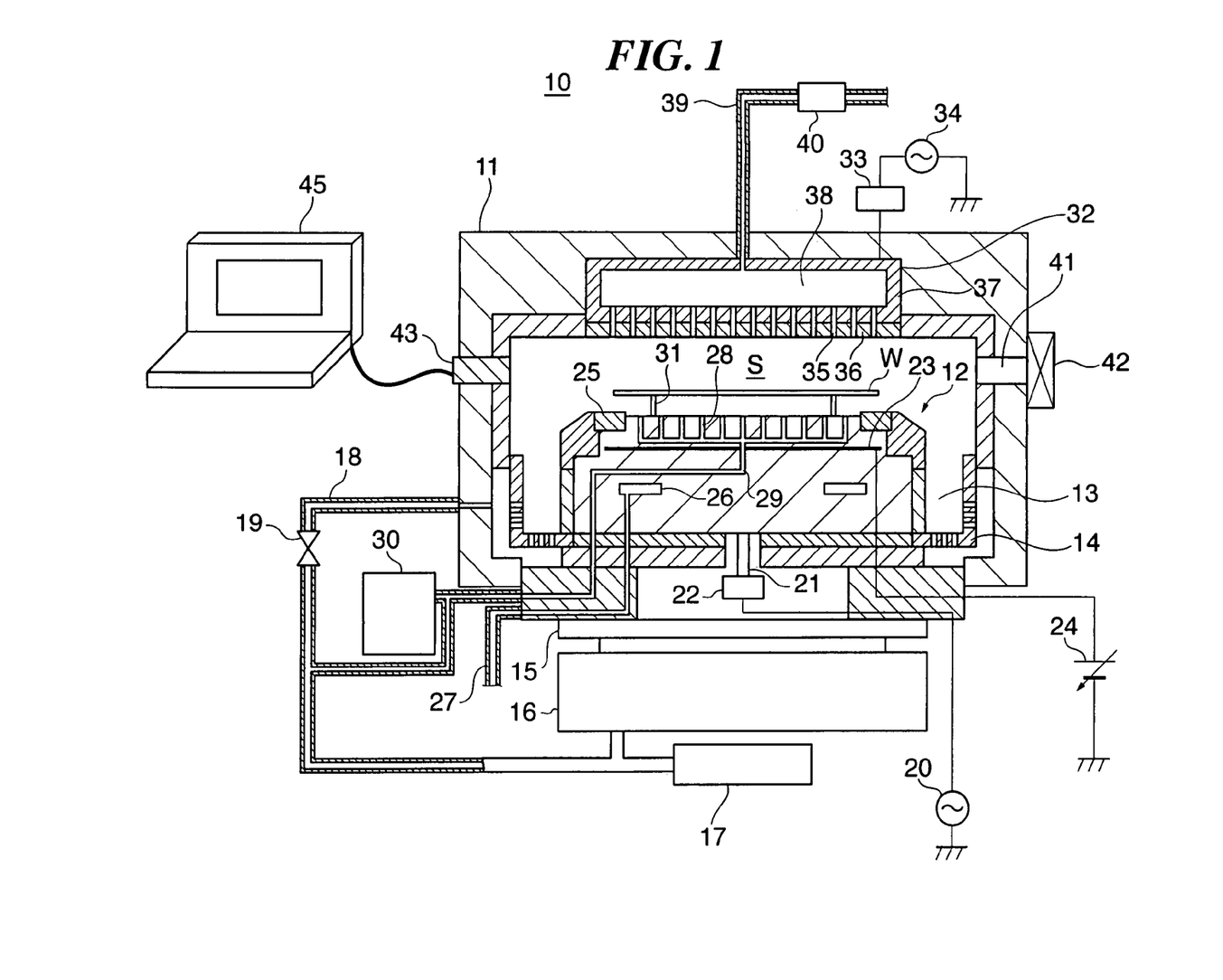
FIG. 1 is a sectional view schematically showing the construction of a parallel plate type plasma processing apparatus to which is applied an electron temperature measurement method according to an embodiment of the present invention.

FIG. 1 is a sectional view schematically showing the construction of a parallel plate type plasma processing apparatus to which is applied an electron temperature measurement method according to an embodiment of the present invention.

As shown in FIG. 1, the plasma processing apparatus 10, which subjects semiconductor device wafers (hereinafter referred to merely as "wafers") W to dry etching (reactive ion etching) (hereinafter referred to as "RIE") as desired plasma processing, has a cylindrical chamber 11 (vacuum processing chamber) made of metal such as aluminum or stainless steel. A cylindrical susceptor 12 is disposed in the chamber 11 as a stage on which is mounted a wafer W having a diameter of, for example, 300 mm.

In the plasma processing apparatus 10, an exhaust path 13 that acts as a flow path through which gas molecules above the susceptor 12 are exhausted to the outside of the chamber 11 is formed between an inside wall of the chamber 11 and a side face of the susceptor 12. An annular baffle plate 14 that prevents leakage of plasma is disposed part way along the exhaust path 13. A space in the exhaust path 13 downstream of the baffle plate 14 bends round below the susceptor 12, and is communicated with an automatic pressure control valve (hereinafter referred to as the "APC valve") 15, which is a variable butterfly valve. The APC valve 15 is connected to a turbo-molecular pump (hereinafter referred to as the "TMP") 16, which is an exhausting pump for evacuation, and via the TMP 16, to a dry pump (hereinafter referred to as the "DP") 17, which is also an exhausting pump. The exhaust flow path comprised of the APC valve 15, the TMP 16 and the DP 17 is hereinafter referred to as the "main exhaust line". The main exhaust line is used for controlling the pressure in the chamber 11 using the APC valve 15, and also for reducing the pressure in the chamber 11 down to a substantially vacuum state using the TMP 16 and the DP 17.

The space in the exhaust path 13 downstream of the baffle plate 14 is also connected to another exhaust flow path (hereinafter referred to as the "roughing line") separate to the main exhaust line. The roughing line is comprised of an exhaust pipe 18 having a diameter of, for example, 25 mm that communicates the above space with the DP 17, and a valve 19 disposed part way along the exhaust pipe 18. The valve 19 is able to shut off the above space from the DP 17. The roughing line is used for exhausting gas in the chamber 11 using the DP 17.

A lower electrode radio frequency power source 20 is connected to the susceptor 12 via a feeder rod 21 and a matcher 22. The lower electrode radio frequency power source 20 supplies predetermined radio frequency electrical power to the susceptor 12. The susceptor 12 thus acts as a lower electrode. The matcher 22 reduces reflection of the radio frequency electrical power from the susceptor 12 so as to maximize the efficiency of the supply of the radio frequency electrical power into the susceptor 12.

A disk-shaped electrode plate 23 comprised of an electrically conductive film is provided in an upper portion of the susceptor 12. A DC power source 24 is electrically connected to the electrode plate 23. A wafer W is attracted to and held on an upper surface of the susceptor 12 through a Johnsen-Rahbek force or a Coulomb force generated by a DC voltage applied to the electrode plate 23 from the DC power source 24. Moreover, an annular focus ring 25 is provided in an upper portion of the susceptor 12 such as to surround the wafer W attracted to and held on the upper surface of the susceptor 12. The focus ring 25 is exposed to a space S, described below, and focuses ions and radicals produced in the space S toward a surface of the wafer W, thus improving the efficiency of the RIE.

An annular coolant chamber 26 that extends, for example, in a circumferential direction of the susceptor 12 is provided inside the susceptor 12. A coolant, for example cooling water, at a predetermined temperature is circulated through the coolant chamber 26 via coolant piping 27 from a chiller unit (not shown). A processing temperature of the wafer W attracted to and held on the upper surface of the susceptor 12 is controlled through the temperature of the coolant.

A plurality of heat-transmitting gas supply holes 28, and heat-transmitting gas supply channels (not shown), are provided in a portion of the upper surface of the susceptor 12 on which the wafer W is attracted and held (hereinafter referred to as the "attracting surface"). The heat-transmitting gas supply holes 28 are connected to a heat-transmitting gas supply unit 30 by a heat-transmitting gas supply line 29 provided inside the susceptor 12. The heat-transmitting gas supply unit 30 supplies a heat-transmitting gas, for example He gas, into a gap between the attracting surface of the susceptor 12 and a rear surface of the wafer W. Moreover, the heat-transmitting gas supply line 29 is connected to the exhaust pipe 18, whereby the gap between the attracting surface of the susceptor 12 and the rear surface of the wafer W can be evacuated using the DP 17.

A plurality of pusher pins 31 are provided in the attracting surface of the susceptor 12 as lifting pins that can be made to project out from the upper surface of the susceptor 12. The pusher pins 31 are connected to a motor (not shown) by a ball screw (not shown), and can thus be moved in an up/down direction in FIG. 1 through rotational motion of the motor, which is converted into linear motion by the ball screw. The pusher pins 31 are housed inside the susceptor 12 when a wafer W is being attracted to and held on the attracting surface of the susceptor 12 so that the wafer W can be subjected to the RIE, and are made to project out from the upper surface of the susceptor 12 so as to lift the wafer W up away from the susceptor 12 when the wafer W is to be transferred out from the chamber 11 after having been subjected to the RIE.

A gas introducing shower head 32 is disposed in a ceiling portion of the chamber 11 so as to be facing and parallel to the susceptor 12. An upper electrode radio frequency power source 34 is connected to the gas introducing shower head 32 via a matcher 33. The upper electrode radio frequency power source 34 supplies predetermined radio frequency electrical power to the gas introducing shower head 32. The gas introducing shower head 32 thus acts as an upper electrode. The matcher 33 has the same function as the matcher 22, described earlier.

The gas introducing shower head 32 has an electrode plate 36 on a lower surface thereof, the electrode plate 36 having therein a large number of gas holes 35, and an electrode support 37 on which the electrode plate 36 is detachably supported. A buffer chamber 38 is provided inside the electrode support 37. A processing gas introducing pipe 39 is connected from a processing gas supply unit (not shown) to the buffer chamber 38. A piping insulator 40 is disposed part way along the processing gas introducing pipe 39. The piping insulator 40 is made of an electrically insulating material, and prevents the radio frequency electrical power supplied to the gas introducing shower head 32 from leaking into the processing gas supply unit via the processing gas introducing pipe 39. A processing gas supplied from the processing gas introducing pipe 39 into the buffer chamber 38 is supplied by the gas introducing shower head 32 into the chamber 11 via the gas holes 35.

A transfer port 41 for the wafers W is provided in a side wall of the chamber 11 in a position at the height of a wafer W that has been lifted up from the susceptor 12 by the pusher pins 31. An ion energy analyzer 43 is further provided in the side wall of the chamber 11 at a predetermined height. A gate valve 42 for opening and closing the transfer port 41 is provided in the transfer port 41.

The ion energy analyzer 43 is, for example, a quadrupole mass spectrometer (QMS) that has filter electrodes and is able to identify ionic species and analyze the energy thereof. As a potential applied to the ion energy analyzer 43 is swept, the ionic species are identified, and moreover the number of ions of each identified species entering the ion energy analyzer 43 in correspondence with the applied potential is measured, whereby the ion energy distribution for a given identified ionic species is measured. Because the ion energy analyzer 43 directly measures the number of ions for a certain specified applied potential, i.e. a certain specified energy, in this way, the ion energy distribution can be measured precisely. Moreover, the ion energy analyzer 43 is connected to a PC (personal computer) 45 having a CPU and so on, and the measured ion energy distribution is sent from the ion energy analyzer 43 to the PC 45 as an electrical signal.

The CPU of the PC 45 estimates the electron temperature of the plasma in the space S in the first process ship 11, the plasma density, and the sheath potential based on the sent ion energy distribution in accordance with a program corresponding to an electron temperature measurement process, described later.

Radio frequency electrical power is supplied to the susceptor 12 and the gas introducing shower head 32 in the chamber 11 of the plasma processing apparatus 10 as described above so as to apply radio frequency electrical power into the space S between the susceptor 12 and the gas introducing shower head 32, whereupon a high-density plasma is produced from the processing gas supplied into the space S from the gas introducing shower head 32, whereby a wafer W is subjected to the RIE by the plasma.

Specifically, when subjecting a wafer W to the RIE in the plasma processing apparatus 10, first the gate valve 42 is opened, and the wafer W to be processed is transferred into the chamber 11, and attracted to and held on the attracting surface of the susceptor 12 by applying a DC voltage to the electrode plate 23. The processing gas (e.g. a mixed gas comprised of $CF_4$ gas, $O_2$ gas and Ar gas with a predetermined flow ratio therebetween) is supplied into the chamber 11 at a predetermined flow and a predetermined flow ratio, and the pressure inside the chamber 11 is controlled to a predetermined value using the APC valve 15 and so on. Furthermore, radio frequency electrical power is supplied to the susceptor 12 and the gas introducing shower head 32, and thus applied into the space S in the chamber 11. The processing gas introduced in from the gas introducing shower head 32 is thus made into a plasma, whereby ions and radicals are produced in the space S. The produced ions and radicals are focused onto the surface of the wafer W by the focus ring 25, whereby the surface of the wafer W is physically/chemically etched.

As described earlier, with the Langmuir probe method or the direct plasma parameter reading method, the measurement cannot follow rapid changes over time in the potential in the chamber caused by the application of the radio frequency electrical power for producing the plasma, and hence the measured electron temperature is imprecise.

In the electron temperature measurement method according to the present embodiment, to solve this problem, the electron temperature is measured indirectly using the ion energy distribution which can be measured precisely. Moreover, in the electron temperature measurement method according to the present embodiment, a sheath model as described below is used to enable the use of the ion energy distribution.

The sheath model is a computational model for simulating the state of a sheath, which is a layer of ions produced on an electrode to which radio frequency electrical power is applied or on a wall in the chamber. The sheath model is rendered on the CPU of the PC 45. The sheath model is used to simulate the energy distribution, angular distribution, and so on of ions or electrons that pass from the plasma in the space S facing the sheath (the plasma bulk) through the sheath and reach the electrode surface or chamber wall, based on plasma parameters such as the electron temperature.

A commonly known sheath model is one in which the radio frequency sheath theory of Lieberman et al. is used. This sheath model is comprised of a sheath region on the wafer W rendered on the CPU of the PC 45, and a plasma bulk region facing the sheath region. The behavior and collisions of electrons and ions in the sheath model are simulated based on the PIC-MCC (Particle-In-Cell Monte Carlo Collisions) method.

It has been verified by the present inventors that the above sheath model enables highly precise simulation of the plasma potential, the sheath thickness, and the electron or ion energy distribution (K. DENPOH, G. WAKAYAMA and K. NANBU, Sheath Model for Dual-Frequency Capacitively Coupled Plasma, Japanese Journal of Applied Physics, Japan, The Japan Society of Applied Physics, 2004, Vol. 43, No. 8A, pp. 5533-5539).

Figure 2:
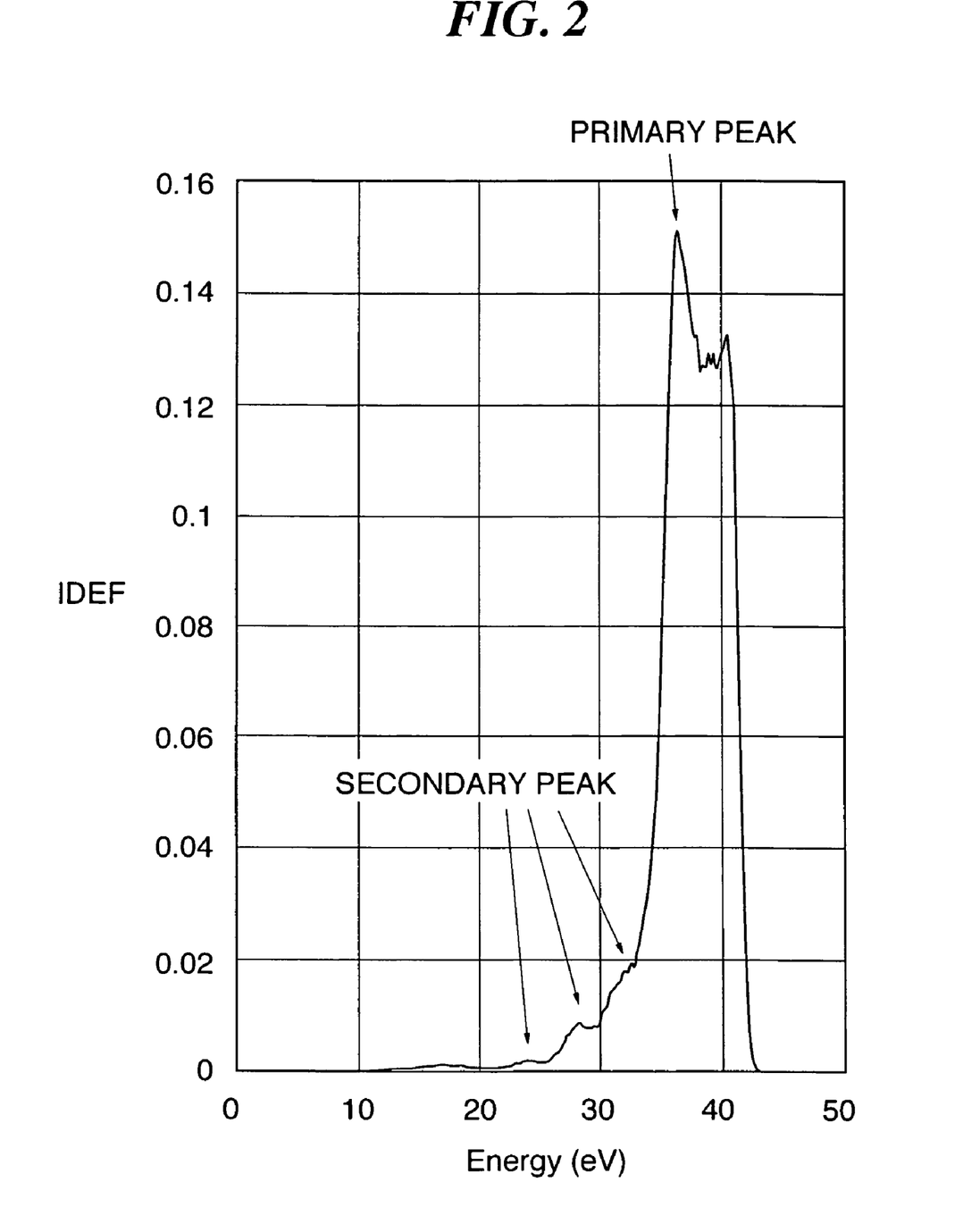
FIG. 2 is a graph showing a measured ion energy distribution for a sheath in a chamber.

Moreover, it is known that there are a plurality of peaks in the ion energy distribution for the sheath in the chamber. Specifically, if the measured ion energy distribution is shown on a graph with the axis of abscissas representing the ion energy value, and the axis of ordinates showing the IEDF (ion energy distribution function), which indicates the number of ions for each energy value, as shown in FIG. 2, then a primary peak where the IEDF is a maximum arises, and moreover secondary peaks arise at energy values lower than the energy value at which the primary peak arises.

It is known that, of the above two types of peaks, the secondary peaks arise due to charge exchange between ions and molecules/atoms in the sheath, specifically in the case that the following equation (1) is satisfied (C. Wild and P. Koidl, Ion and electron dynamics in the sheath of radio-frequency glow discharges, Japanese Journal of Applied Physics, Japan, The Japan Society of Applied Physics, 1 Mar. 1991, 69(5), pp. 2909-2922).

$$\tau_{ion}/\tau_{rf} > 1 \quad (1)$$

Here, $\tau_{ion}$ represents the time taken for an ion to pass through the sheath, and $\tau_{rf}$ represents one period of the radio frequency electrical power applied to the electrode (susceptor 12 or gas introducing shower head 32).

To verify this cause of the secondary peaks arising, the present inventors simulated the ion energy distribution with consideration given to charge exchange between ions and molecules/atoms, for example Ar cations and Ar molecules/atoms, in the sheath model, and also simulated the ion energy distribution with no consideration given to such charge exchange between ions and molecules/atoms. The ion energy distributions resulting from the simulations are shown on a graph in FIG. 3, described below.

Figure 3:
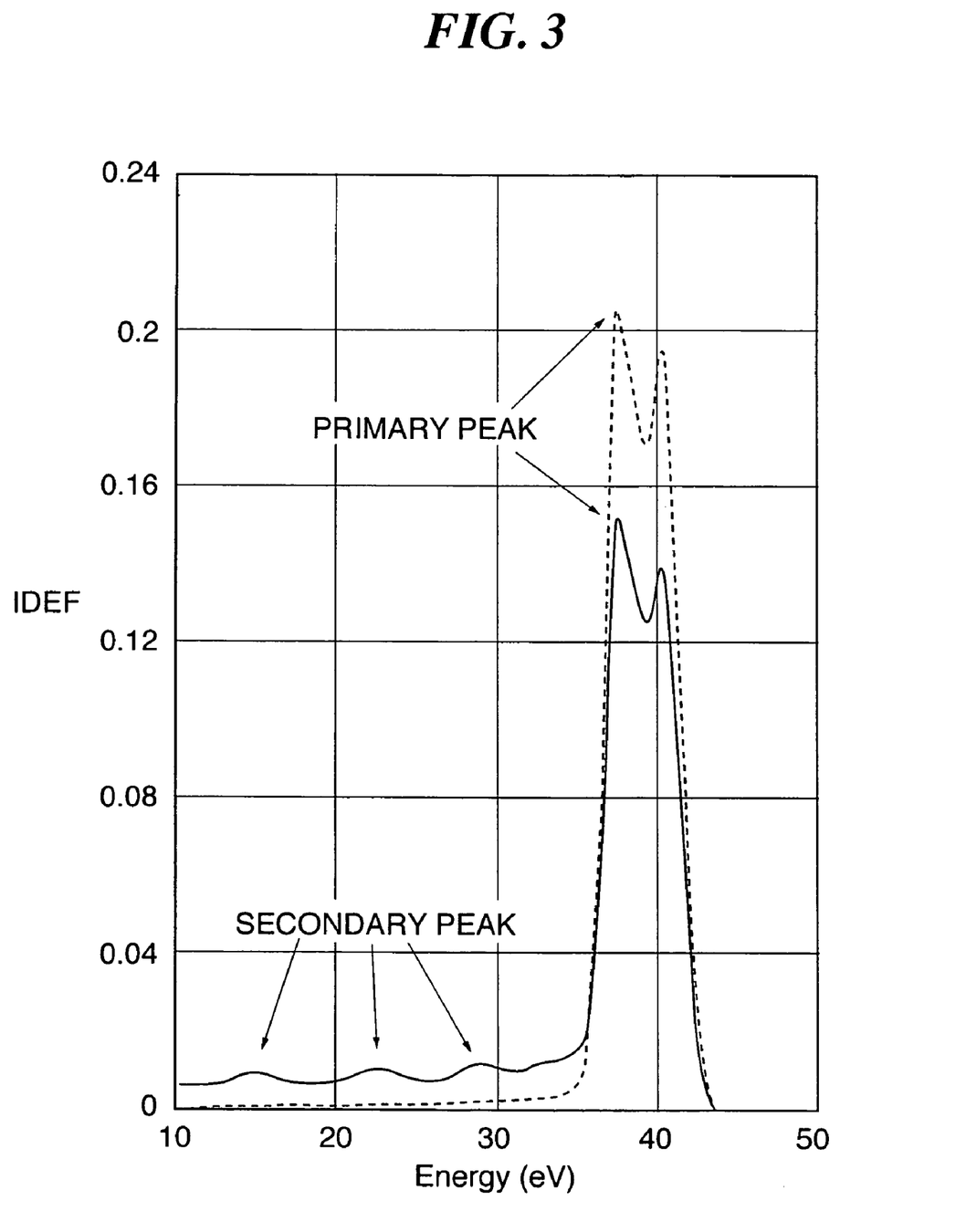
FIG. 3 is a graph showing the relationship between charge exchange between ions and molecules/atoms in the sheath and occurrence of secondary peaks.
Figure 4:
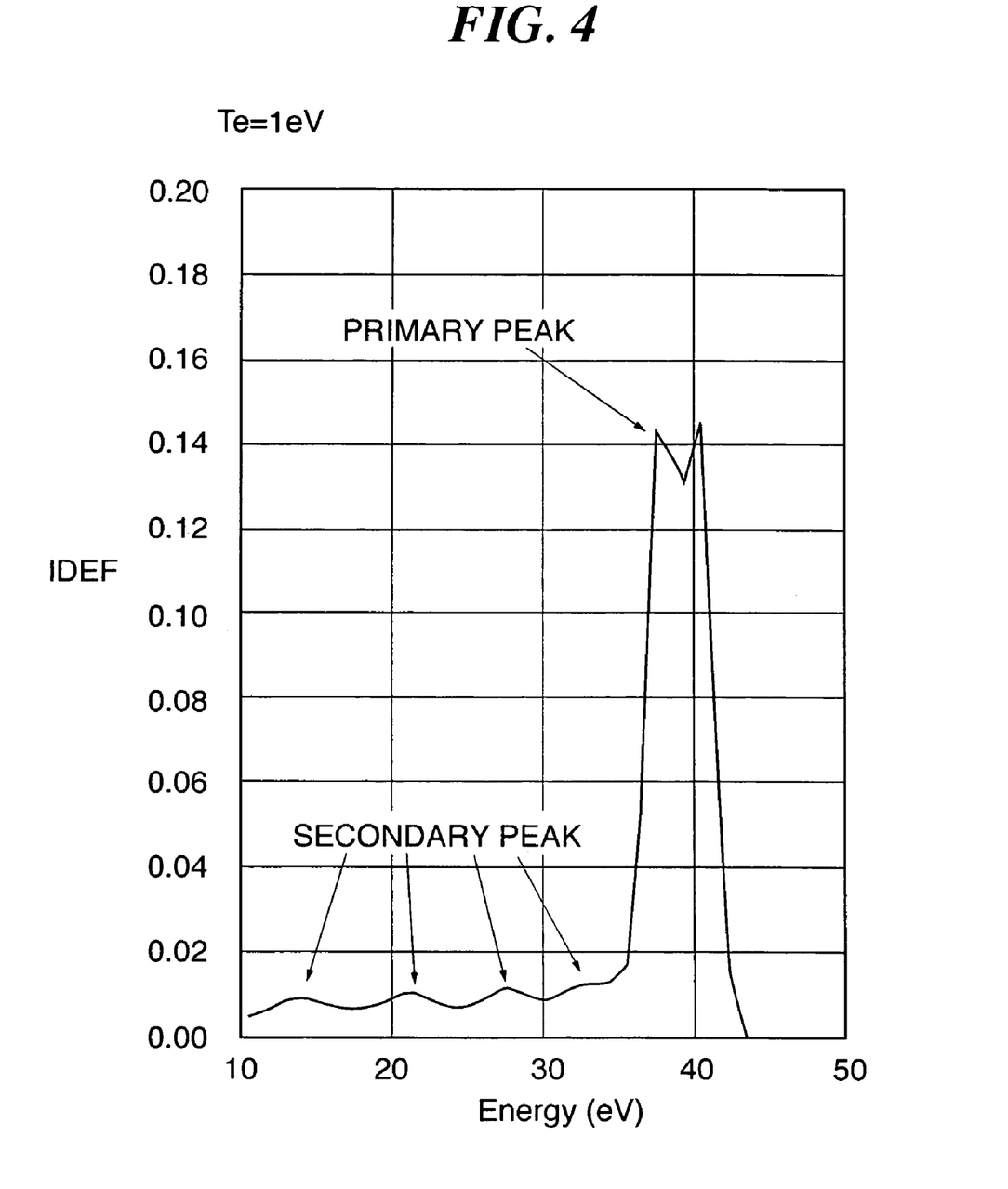
FIG. 4 is a graph showing ion energy distribution simulation results with an electron temperature set to 1.0 eV.
Figure 5:
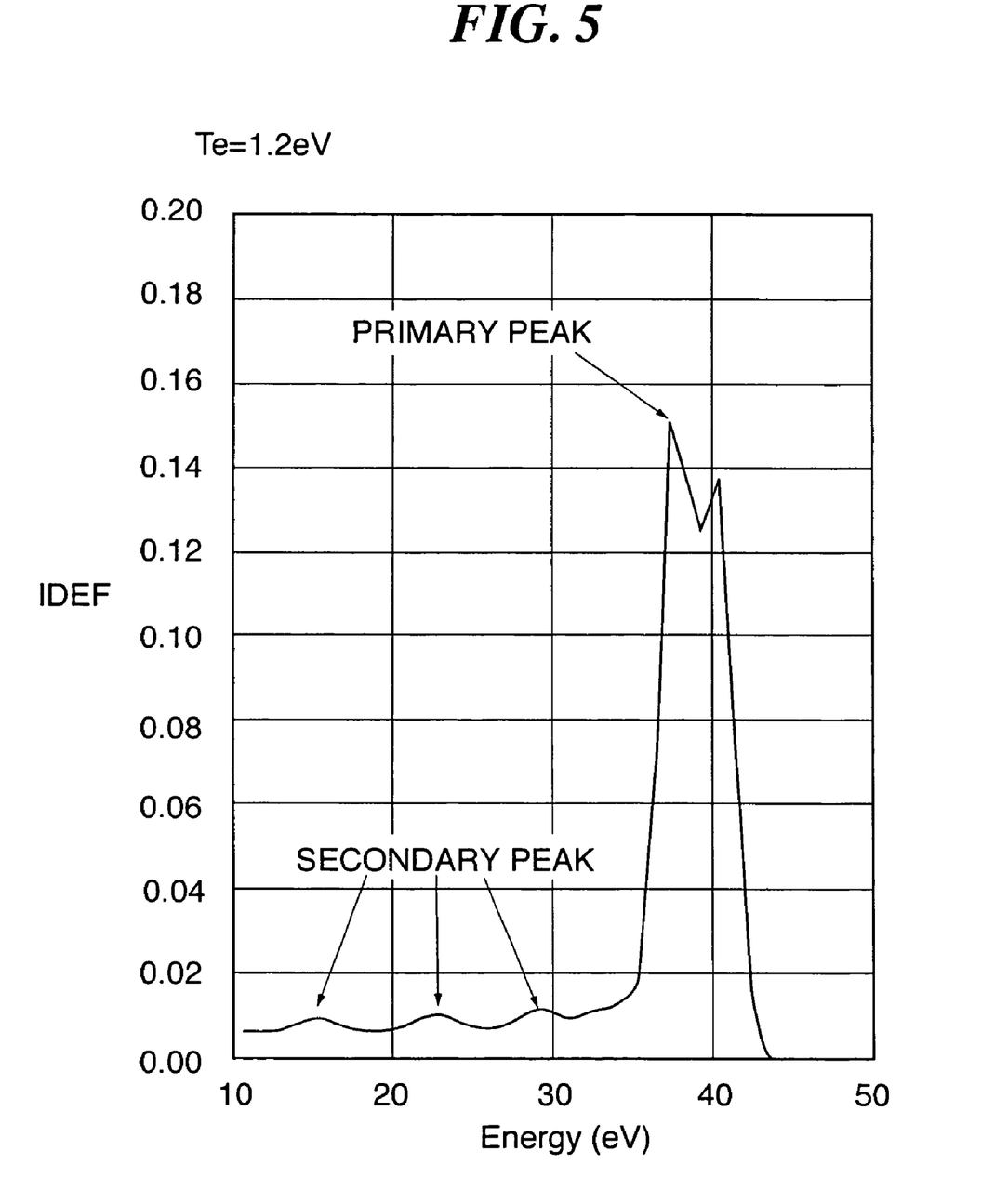
FIG. 5 is a graph showing ion energy distribution simulation results with the electron temperature set to 1.2 eV.
Figure 6:
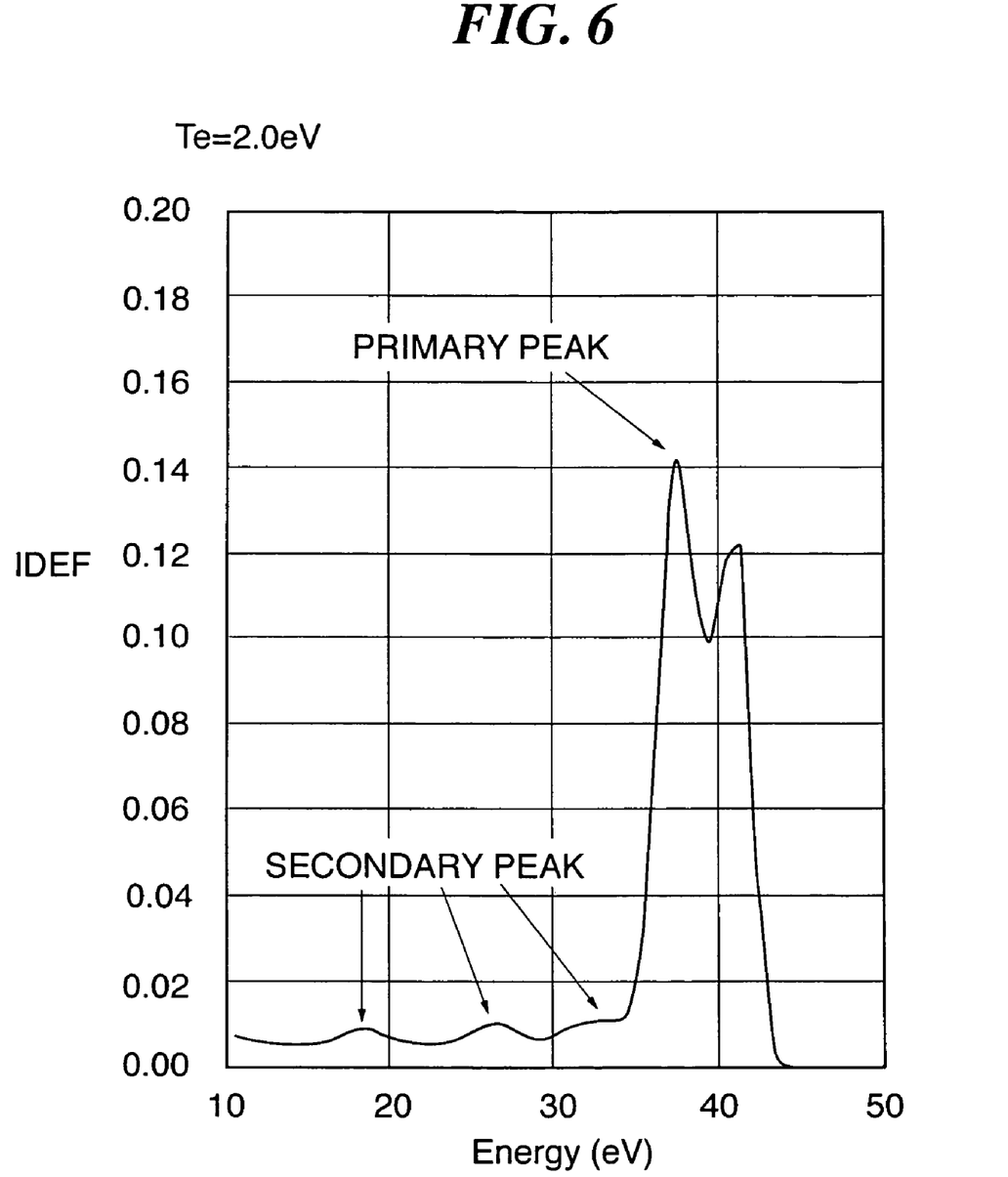
FIG. 6 is a graph showing ion energy distribution simulation results with the electron temperature set to 2.0 eV.
Figure 7:
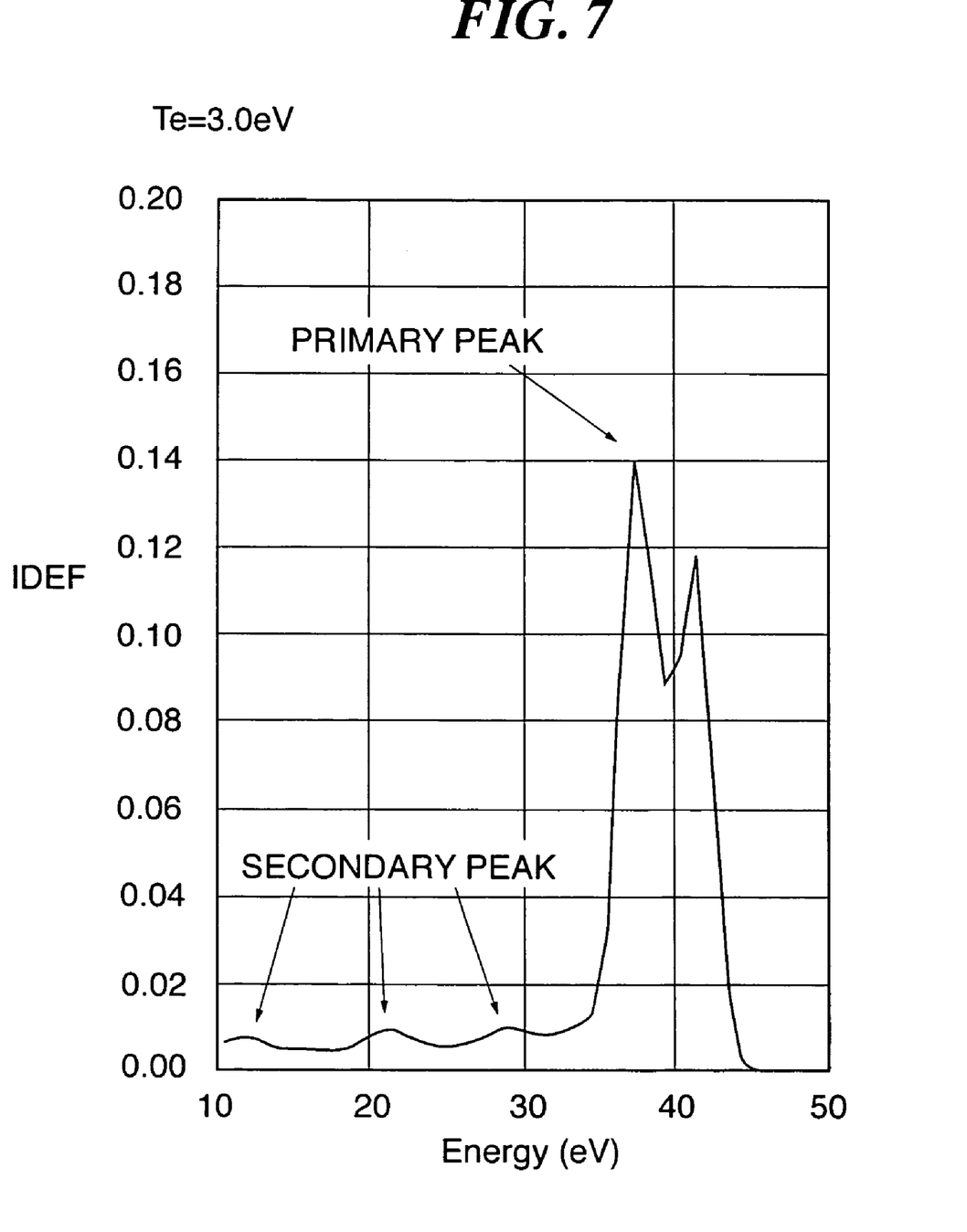
FIG. 7 is a graph showing ion energy distribution simulation results with the electron temperature set to 3.0 eV.

FIG. 3 is a graph showing the relationship between charge exchange between ions and molecules/atoms in the sheath and the occurrence of secondary peaks.

In FIG. 3, the results of simulating the ion energy distribution with consideration given to charge exchange between ions and molecules/atoms are shown by the full line, whereas the results of simulating the ion energy distribution with no consideration given to charge exchange between ions and molecules/atoms are shown by the broken line.

As shown in FIG. 3, in the ion energy distribution shown by the broken line, there is a primary peak, but there are no secondary peaks at energy values lower than that of the primary peak. On the other hand, in the ion energy distribution shown by the full line, there are both a primary peak and secondary peaks. It can thus be concluded that the secondary peaks arise due to charge exchange between ions and molecules/atoms in the sheath.

Note that the lower the pressure in the chamber 11, or the higher the frequency of the radio frequency power source, or the higher the sheath potential, the more readily above equation (1) is satisfied, and hence the more readily secondary peaks arise.

The present inventors also set the electron temperature to each of a plurality of values, specifically 1.0 eV, 1.2 eV, 2.0 eV, and 3.0 eV, when simulating the ion energy distribution with consideration given to charge exchange between ions and molecules/atoms in the above sheath model, whereupon it was discovered that the energy values at which the secondary peaks arise change with changing electron temperature.

FIGS. 4 to 7 are graphs showing the ion energy distribution simulation results with the electron temperature set respectively to 1.0 eV, 1.2 eV, 2.0 eV, and 3.0 eV; in each case, Ar gas was taken as the gas introduced into the chamber 11, the pressure in the chamber 11 was set to $4.0 \times 10^3$ Pa (30 mTorr), the frequency of the radio frequency electrical power applied to the electrode plate 36 of the gas introducing shower head 32 was set to 60 MHz, the sheath potential was set to 92 V, and the plasma density was set to $3 \times 10^{10}$ cm$^{-3}$.

As shown in FIGS. 4 to 7, the energy values at which the secondary peaks arise change upon the electron temperature changing. The present inventors thus discovered that there is a strong correlation between the energy values at which the secondary peaks arise and the electron temperature.

Moreover, it is also known that the energy value and IEDF at the primary peak change with changes in the plasma density and the sheath potential, and hence there is a strong correlation between the energy value and IEDF at which the primary peak arises and the plasma density and the sheath potential. Note that the reason that the IEDF at the primary peak and the energy value at which the primary peak arises do not change in FIGS. 4 to 7 is that the plasma density and the sheath potential were set to be constant throughout FIGS. 4 to 7.

In the electron temperature measurement method according to the present embodiment, based on the knowledge that there is a strong correlation between the energy values at which the secondary peaks arise in the ion energy distribution in the chamber 11 and the electron temperature, the ion energy distribution can be measured precisely, and moreover the ion energy distribution can be simulated with the electron temperature set to a predetermined value, the ion energy distribution in the chamber 11 is measured, the electron temperature is set to a predetermined value and the ion energy distribution is simulated based on this set electron temperature value using the sheath model, and the secondary peaks in the measured ion energy distribution (hereinafter referred to as the "measured secondary peaks") and the secondary peaks in the simulated ion energy distribution (hereinafter referred to as the "simulated secondary peaks") are compared, whereby the electron temperature of the plasma in the space S in the chamber 11 is estimated.

Figure 8:
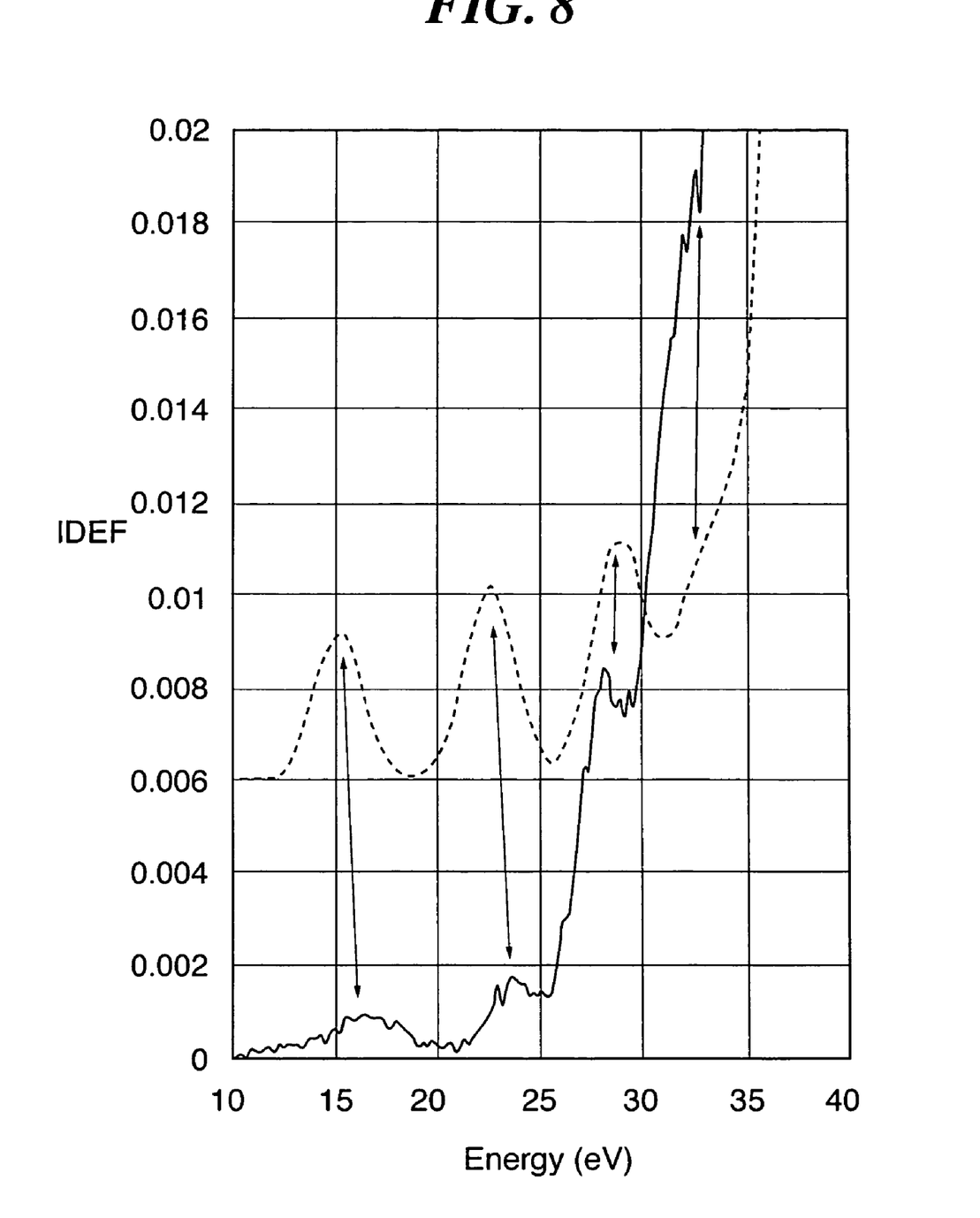
FIG. 8 is a graph explaining a method of comparing energy values of measured secondary peaks with energy values of simulated secondary peaks, for estimating the electron temperature of a plasma in a chamber.

Specifically, as shown in the graph in FIG. 8, the energy values of the measured secondary peaks shown by the full line and the energy values of the simulated secondary peaks shown by the broken line are compared, and in the case that there is no discrepancy in the energy value between each measured secondary peak and the corresponding simulated secondary peak (the peaks paired together by the arrows in FIG. 8) or this discrepancy is within a predetermined tolerance, the electron temperature used in the simulation of the ion energy distribution is estimated as being the electron temperature of the plasma in the space S in the chamber 11.

Moreover, in the electron temperature measurement method according to the present embodiment, based on the knowledge that there is a strong correlation of the energy value at which the primary peak arises in the ion energy distribution in the chamber 11 with the plasma density and sheath potential, and moreover the ion energy distribution can be simulated with the plasma density and sheath potential each set to a predetermined value, the plasma density and the sheath potential are each set to a predetermined value and the ion energy distribution is simulated based on these set plasma density and sheath potential values using the sheath model, and the primary peak in the measured ion energy distribution (hereinafter referred to as the "measured primary peak") and the primary peak in the simulated ion energy distribution (hereinafter referred to as the "simulated primary peak") are compared, whereby the plasma density and sheath potential in the space S in the chamber 11 are estimated.

Specifically, the energy value of the measured primary peak and the energy value of the simulated primary peak are compared, and in the case that the discrepancy in the energy value between the measured primary peak and the corresponding simulated primary peak is within a predetermined tolerance, the plasma density and sheath potential used in the simulation of the ion energy distribution are estimated as being the plasma density and sheath potential in the space S in the chamber 11.

Next, a description will be given of an electron temperature measurement process for the electron temperature measurement method according to the present embodiment. The electron temperature measurement process is implemented by the CPU of the PC 45 in accordance with a program corresponding to the electron temperature measurement process.

Figure 9:
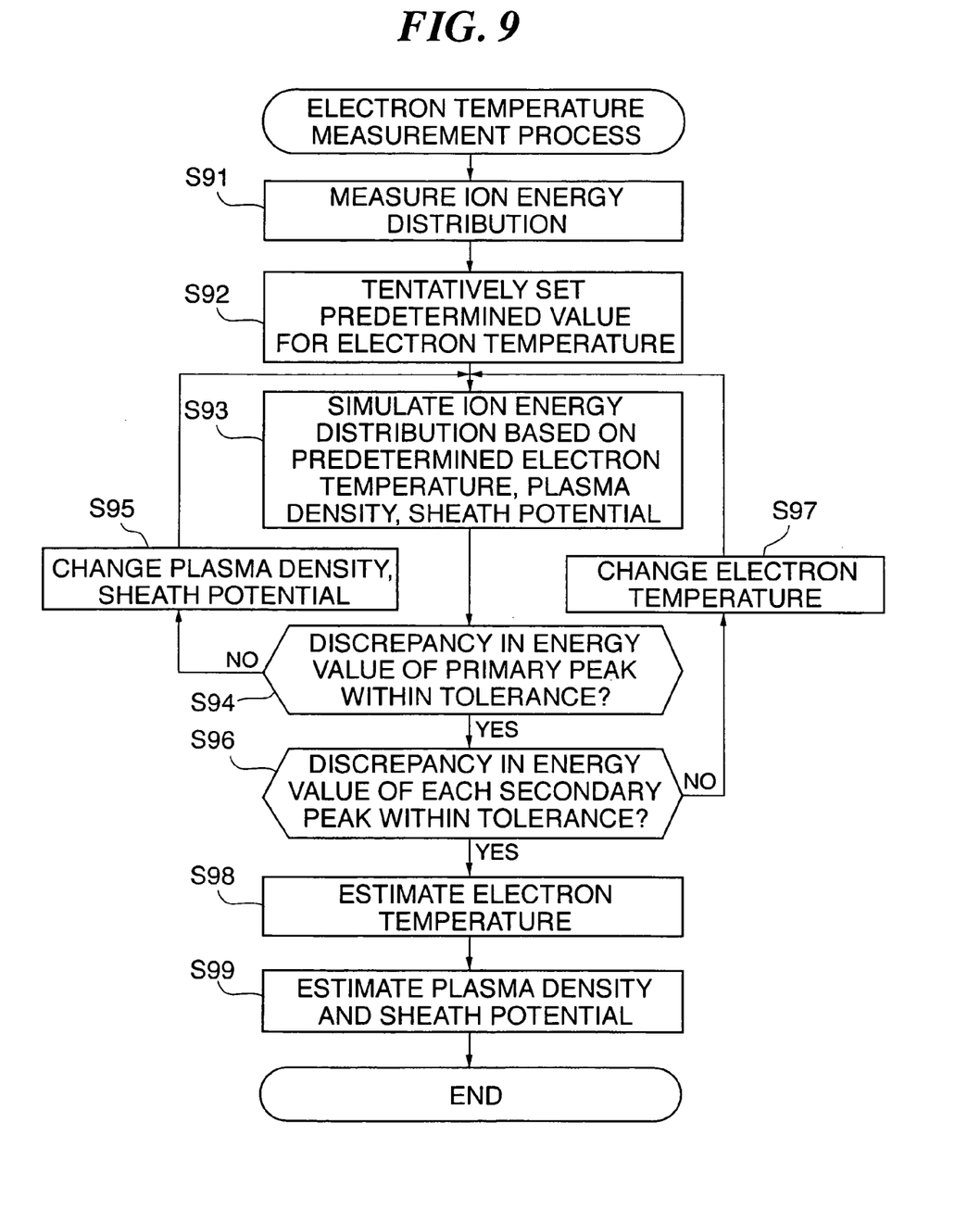
FIG. 9 is a flowchart of an electron temperature measurement process implemented by a CPU of a PC shown in FIG. 1.

FIG. 9 is a flowchart of the electron temperature measurement process implemented by the CPU of the PC shown in FIG. 1.

In FIG. 9, first, the CPU of the PC 45 measures the ion energy distribution in the chamber 11 using the ion energy analyzer 43 (step S91).

Next, the CPU tentatively sets the electron temperature to a predetermined value, for example the electron temperature measured in the processing on a previous occasion (step S92), and further sets each of the plasma density and the sheath potential to a predetermined value, and then simulates the ion energy distribution using the sheath model based on these set plasma parameters (step S93).

Next, in step S94, the measured primary peak and the simulated primary peak are compared, and it is determined whether or not the discrepancy in the energy value between the measured primary peak and the corresponding simulated primary peak is within a predetermined tolerance.

In the case that it is determined that the discrepancy in the energy value is within the tolerance (YES in step S94), the process proceeds to step S96, whereas in the case that the discrepancy in the energy value is not within the tolerance (NO in step S94), the plasma density and the sheath potential are each changed to a new predetermined value (step S95), and the process returns to step S93 and the ion energy distribution is re-simulated.

Next, in step S96, the plurality of measured secondary peaks and the plurality of simulated secondary peaks are compared with one another, and it is determined whether or not the discrepancy in the energy value between each measured secondary peak and the corresponding simulated secondary peak is within a predetermined tolerance.

In the case that it is determined that the discrepancy in each energy value is within the tolerance (YES in step S96), the process proceeds to step S98, whereas in the case that the discrepancy in at least one energy value is not within the tolerance (NO in step S96), the electron temperature is changed to a new predetermined value (step S97), and the process returns to step S93 and the ion energy distribution is re-simulated.

Next, the CPU estimates the electron temperature used in the simulation of the ion energy distribution in step S93 as being the electron temperature of the plasma in the space S in the chamber 11 (step S98), and estimates the plasma density and sheath potential used in the simulation as being the plasma density and sheath potential in the space S in the chamber 11 (step S99), and then the present process comes to an end.

According to the electron temperature measurement method of the present embodiment, the ion energy distribution in the chamber 11 is measured (step S91), the ion energy distribution is simulated using the sheath model based on a tentatively set predetermined value for the electron temperature (step S93), it is determined whether or not the discrepancy in the energy value between each measured secondary peak and the corresponding simulated secondary peak is within a predetermined tolerance (step S96), and in the case that it is determined that the discrepancy in each energy value is within the tolerance, the electron temperature used in the simulation of the ion energy distribution is estimated as being the electron temperature of the plasma in the space S in the chamber 11 (step S98).

As described earlier, there is a strong correlation between the energy values at which the secondary peaks arise in the ion energy distribution and the electron temperature. Moreover, the ion energy distribution can be measured precisely, and furthermore the ion energy distribution can be simulated with the electron temperature set to a predetermined value. Consequently, in the case that the discrepancy in the energy value between each measured secondary peak and the corresponding simulated secondary peak is within the predetermined tolerance, if the electron temperature used in the simulation of the ion energy distribution is estimated as being the electron temperature of the plasma in the space S in the chamber 11, then the electron temperature can be measured precisely.

Moreover, in the above electron temperature measurement method, the electron temperature used in the ion energy distribution simulation is tentatively set to a predetermined value. As a result, the number of times that the ion energy distribution simulation is repeated in accordance with the results of the comparison between the energy value of each measured secondary peak and the energy value of the corresponding simulated secondary peak can be reduced, and hence the electron temperature can be measured quickly.

Furthermore, according to the above electron temperature measurement method, the ion energy distribution is simulated using the sheath model based on set predetermined values for the plasma density and the sheath potential (step S93), it is determined whether or not the discrepancy in the energy value between the measured primary peak and the simulated primary peak is within a predetermined tolerance (step S94), and in the case that it is determined that the discrepancy in the energy value is within the tolerance, the plasma density and sheath potential used in the simulation of the ion energy distribution are estimated as being the plasma density and sheath potential in the space S in the chamber 11 (step S99).

As described earlier, there is a strong correlation of the energy value at which the primary peak arises in the ion energy distribution with the plasma density and sheath potential. Moreover, the ion energy distribution can be simulated with the plasma density and sheath potential each set to a predetermined value. Consequently, in the case that the discrepancy in the energy value between the measured primary peak and the simulated primary peak is within the predetermined tolerance, if the plasma density and sheath potential used in the simulation of the ion energy distribution are estimated as being the plasma density and sheath potential in the space S in the chamber 11, then the plasma density and sheath potential can be measured precisely.

In the electron temperature measurement method according to the embodiment described above, the ion energy analyzer 43 is preferably earthed reliably. As a result, the ion energy analyzer 43 can be prevented from becoming charged, and hence the ion energy value can be measured precisely.

Moreover, in the electron temperature measurement method according to the embodiment described above, the ion energy analyzer 43 is provided in the side wall of the chamber 11. However, the ion energy analyzer may instead be provided in the upper electrode or the lower electrode.

In the electron temperature measurement method according to the embodiment described above, the CPU of the PC 45 repeats the ion energy distribution simulation using the sheath model every time the electron temperature and so on are changed. However, an arrangement may instead be adopted in which simulated ion energy distribution results based on each of a plurality of set electron temperature values are held in an HDD or the like of the PC 45 in advance, and the energy values of the measured secondary peaks are compared with the energy values of the secondary peaks in each of the held simulated ion energy distributions. In this case, a held simulated ion energy distribution having secondary peaks for which the discrepancy in the energy value with each corresponding measured secondary peak is within the predetermined tolerance is searched for, and then once such a simulated ion energy distribution has been found, the electron temperature used in the simulation of this ion energy distribution is estimated as being the electron temperature of the plasma in the space S in the chamber 11. As a result, the need to repeat the ion energy distribution simulation can be eliminated, and hence the electron temperature of the plasma in the space S in the chamber 11 can be measured more quickly.

Moreover, in the electron temperature measurement method according to the embodiment described above, the electron temperature measurement process shown in FIG. 9 is implemented by the CPU of the PC 45. However, the plasma processing apparatus 10 may have a controller unit that controls operations of the various component elements of the plasma processing apparatus 10, and the electron temperature measurement process shown in FIG. 9 may by implemented by this controller unit. In this case, there is no need for the plasma processing apparatus 10 to have the PC 45, and hence the plasma processing apparatus 10 can be made more compact.

Moreover, the plasma density can be measured relatively precisely using the plasma absorption probe method, and hence it is not necessary to estimate the plasma density in the electron temperature measurement method as in the embodiment described above. By measuring the plasma density in this way, the need to set the plasma density to a predetermined value in the ion energy distribution simulation is eliminated, and hence the electron temperature can be measured more quickly.

The plasma processing apparatus 10 to which is applied the electron temperature measurement method according to the embodiment described above is an etching apparatus that carries out RIE on wafers W. However, the plasma processing apparatus to which is applied the electron temperature measurement method according to the present invention is not limited thereto, but rather may be, for example, a substrate cleaning apparatus or a film deposition apparatus.

Furthermore, the substrates processed in the plasma processing apparatus 10 described above are semiconductor device wafers. However, the substrates processed are not limited thereto, but rather may instead be, for example, LCD (liquid crystal display) or FPD (flat panel display) glass substrates.

Moreover, in the plasma processing apparatus 10 described above, the CPU of the PC 45 connected to the ion energy analyzer 43 estimates the electron temperature of the plasma, the plasma density, and the sheath potential in the space S in the chamber 11 based on an ion energy distribution sent from the ion energy analyzer 43 to the PC 45. However, an arrangement may instead be adopted in which another PC connected to the PC 45 by an internet, a commercial network, a local area network, or the like receives the ion energy distribution from the PC 45, and a CPU of the other PC then estimates the electron temperature of the plasma, the plasma density, and the sheath potential in the space S in the chamber 11 in accordance with a program corresponding to the electron temperature measurement process described above.

It is to be understood that the object of the present invention can also be attained by supplying to the PC 45 a storage medium in which is stored a program code of software that realizes the functions of an embodiment as described above, and then causing the CPU of the PC 45 to read out and execute the program code stored in the storage medium.

In this case, the program code itself read out from the storage medium realizes the functions of the embodiment, and hence the program code and the storage medium in which the program code is stored constitute the present invention.

The storage medium for supplying the program code may be any storage medium in which the program code can be stored, for example a RAM, an NV-RAM, floppy (registered trademark) disk, a hard disk, an optical disk, a magnetic-optical disk, a CD-ROM, an MO, a CD-R, a CD-RW, a DVD-ROM, a DVD-RAM, a DVD-RW, a DVD+RW, a magnetic tape, a nonvolatile memory card, or a ROM. Alternatively, the program code may be supplied to the PC 45 by being downloaded from another computer, a database, or the like, not shown, connected to an internet, a commercial network, a local area network, or the like.

Moreover, it is to be understood that the functions of the embodiment can be accomplished not only by executing a program code read out by the PC 45, but also by causing an OS (operating system) or the like which operates on the CPU of the PC 45 to perform a part or all of the actual operations based on instructions of the program code.

Furthermore, it is to be understood that the functions of the embodiment can also be accomplished by writing a program code read out from a storage medium into a memory provided on an expansion board inserted into the PC 45 or in an expansion unit connected to the PC 45 and then causing a CPU or the like provided on the expansion board or in the expansion unit to perform a part or all of the actual operations based on instructions of the program code.

The form of the program code may be, for example, object code, a program code executed by an interpreter, or script data supplied to an OS.

What is claimed is:

1. An electron temperature estimation method for estimating an electron temperature of a plasma produced in a vacuum processing chamber in which an object to be processed is subjected to plasma processing, the method comprising:
    step of simulating ion energy distributions corresponding to a plurality of set point electron temperatures in the said vacuum processing chamber and acquiring plurality of simulation results including primary and secondary peaks;
    step of measuring an ion energy distribution in the said vacuum processing chamber;
    step of comparing the measured ion energy distribution to each of a plurality of simulation results, wherein the step of comparison comprises:
    comparing energy value of each secondary peak of the measured ion energy distribution to corresponding secondary peaks of each of the plurality of simulation results and determining discrepancy in each case;
    estimating the electron temperature of the given processing chamber plasma as the one, corresponding to which the discrepancy is within a predetermined tolerance.

2. An electron temperature estimation method as claimed in claim 1, wherein in said simulating ion energy distributions step, an electron temperature determined in plasma processing on a previous occasion is used as one of the plurality of set point electron temperatures.

3. A computer-readable storage medium storing a program for causing a computer to implement an electron temperature estimation method for estimating an electron temperature of a plasma produced in a vacuum processing chamber in which an object to be processed is subjected to plasma processing, the electron temperature estimation method comprising:
    step of simulating ion energy distributions corresponding to a plurality of set point electron temperatures in the said vacuum processing chamber and acquiring plurality of simulation results including primary and secondary peaks;
    step of measuring an ion energy distribution in the said vacuum processing chamber;
    step of comparing the measured ion energy distribution to each of a plurality of simulation results, wherein the step of comparison comprises:
    comparing energy value of each secondary peak of the measured ion energy distribution to corresponding secondary peaks of each of the plurality of simulation results and determining discrepancy in each case;
    estimating the electron temperature of the given processing chamber plasma as the one, corresponding to which the discrepancy is within a predetermined tolerance.

4. A computer-readable storage medium as claimed in claim 3, wherein in the simulating ion energy distributions step, an electron temperature estimated in plasma processing on a previous occasion is used as one of the plurality of set point electron temperatures.

* * * * *